(12) United States Patent
Gilton

(10) Patent No.: US 6,372,519 B1
(45) Date of Patent: *Apr. 16, 2002

(54) IN-SITU FORMATION OF METAL OXIDE AND FERROELECTIC OXIDE FILMS

(75) Inventor: Terry L. Gilton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/598,783

(22) Filed: Jun. 21, 2000

Related U.S. Application Data

(62) Division of application No. 08/862,194, filed on May 23, 1997, now Pat. No. 6,177,361.

(51) Int. Cl.[7] .............................................. H01L 21/00
(52) U.S. Cl. ........................... 438/3; 438/240; 438/663; 438/682; 257/295; 257/532
(58) Field of Search ................ 438/3, 240, 682, 438/683, 686; 257/295, 532, 768

(56) References Cited

U.S. PATENT DOCUMENTS

| | | | |
|---|---|---|---|
| 5,106,827 A | 4/1992 | Borden et al. ................ 505/1 |
| 5,187,638 A | 2/1993 | Sandhu et al. .............. 361/313 |
| 5,188,902 A | 2/1993 | Lin ............................. 428/426 |
| 5,273,927 A | 12/1993 | Gnadinger .................... 438/3 |
| 5,293,075 A | 3/1994 | Onishi et al. ................ 257/769 |
| 5,397,446 A | 3/1995 | Ishihara et al. ........ 204/192.18 |
| 5,431,958 A | 7/1995 | Desu et al. ............... 427/255.3 |
| 5,443,688 A | 8/1995 | Toure et al. .................. 216/13 |
| 5,466,629 A | 11/1995 | Mihara et al. ................. 438/3 |
| 5,491,102 A * | 2/1996 | Desu et al. .................... 438/3 |
| 5,572,052 A | 11/1996 | Kashihara et al. .......... 257/295 |
| 5,635,420 A | 6/1997 | Nishioka ....................... 438/3 |
| 5,773,314 A | 6/1998 | Jiang et al. .................... 438/3 |
| 5,824,590 A | 10/1998 | New et al. ................... 438/393 |
| 6,177,361 B1 * | 1/2001 | Gilton ......................... 438/785 |

OTHER PUBLICATIONS

Ishizawa, N., et al., "Crystalline BaTio3 Thin Film Prepared from Ti Metal by Hydrothermal–Electrochemical Method", *Materials Research Society*, vol. 200, (1990).

* cited by examiner

Primary Examiner—Charles Bowers
Assistant Examiner—Hsien-Ming Lee
(74) Attorney, Agent, or Firm—Schwegman, Lundberg Woessner & Kluth, P.A.

(57) ABSTRACT

A method of in-situ formation of ferroelectric films including the steps of: forming a starting layer of metal on top of an oxide layer, wherein the metal for the starting layer is capable of forming a ferroelectric material by reducing the underlying oxide layer. Further incorporating into the starting layer at least a second metal capable of being oxidized by the products of the reduction of the oxide layer by the first metal, forming a layer containing a plurality of metals; and heating the plurality of metals layer in the presence of nitrogen.

68 Claims, 3 Drawing Sheets

IN-SITU FORMATION OF METAL OXIDE AND FERROELECTRIC OXIDE FILMS

This application is a Divisional of U.S. application Ser. No. 08/862,194, filed May 23, 1997 now U.S. Pat. No. 6,177,361.

BACKGROUND OF THE INVENTION

1. Technical Field

This invention relates generally to a method of in-situ formation of a metal oxide material. In particular to the in-situ forming of ferroelectric or films with a ferroelectric oxide.

2. Background

In order to build an integrated circuit, many active devices need to be fabricated on a single substrate. The current practice in semiconductor manufacturing is to use thin film fabrication techniques. A large variety of materials can be deposited using thin films, including metals, semiconductors, insulators and the like. The semiconductor industry's continuing drive towards closer and smaller device geometries, has placed an increased demand for cost-effective solutions for the fabrication problems related to the decreasing geometries. Several problems arise, in particular for memory circuits.

One of the most commonly used memory circuits are random access memory (RAM) circuits. RAM is generally used as the basic high speed memory in digital computers. One problem with these memories is that the memories are generally volatile. A memory device is called volatile if the stored data disappears after a power loss or interruption. In many applications, sudden loss of the stored data in these memories is undesirable. A memory device is called non-volatile if the stored data will not disappear, even after a power break. Ferroelectrics can be used in RAM memory circuits for the insulation or dielectric layer in the data-storage capacitors in memory circuits to achieve nonvolatility.

Ferroelectrics are compatible with conventional wafer processing and memory circuits. A ferroelectric is a dielectric material that exhibits hysteresis such that a large amount of polarization will survive even when the electric field is reduced to zero. This allows a capacitor made with a ferroelectric insulating layer to permanently retain charge after application of a voltage. Because of the molecular structure of a ferroelectric it can retain a charge in two different configurations, giving it essentially binary capabilities desirable for use in RAM memory circuits.

A second problem for RAM circuits, resulting from the ever shrinking size also has to do with the functioning of the capacitor. With a conventional capacitor, when the area is made very small, the capacitor is unable to accumulate enough charge to operate the semiconductor memory circuit correctly. One possible solution to this problem is to use an insulating film with a high dielectric constant. In addition to providing the characteristic of nonvolatility for memory circuits, ferroelectric capacitors also have a comparatively much higher dielectric constant than more conventional silicon dioxide capacitors and can be used to mitigate the charge accumulation problem. Because ferroelectrics have a high dielectric constant much smaller ferroelectric capacitors may be used in place of silicon dioxide capacitors. This allows RAM memory circuits made with ferroelectric capacitors to store a sufficient charge in a smaller area. This is extremely advantageous as active area dimensions evolve towards the submicron level to meet the ever decreasing space requirements in circuit fabrication.

Many ferroelectric materials exhibit the same atomic structure as a regular perovskite crystal. A unit cell of a perovskite crystal has a general chemical formula of $ABO_3$, where A is a large cation and B is a small cation. A perovskite crystal has a central metallic ion that is displaced into one of two positions along the axis of an applied electric field to create an electric dipole. The central ion remains polarized until an electric field is again applied to reverse it. In addition to their ferroelectric properties, the materials with perovskite structure are also known to be useful for their electro-optic properties and superconducting properties.

A variety of techniques have been used for the deposition of ferroelectrics as thin films. Techniques that have been used include wet chemical processes, chemical vapor deposition (CVD) processes and physical vapor deposition (PVD) processes. The wet chemical processes encompass sol-gel processes and metalorganic decomposition.

The PVD processes include, for example, molecular beam epitaxy, electron beam evaporation, ion beam sputtering, radio frequency (rf) diode sputtering, rf magnetron sputtering, dc magnetron sputtering, and laser ablation.

Ishihara, U.S. Pat. No. 5,397,446 describes a method of forming a ferroelectric film that includes forming a first layer by sputtering at a first pressure, and forming a second layer on the first layer by sputtering at a second lower pressure.

Gnadinger, U.S. Pat. No. 5,273,927 teaches a five step process that includes forming a layer of insulative material on a source, followed by the formation of a first conductive layer on top of the insulative layer, then the construction of a ferroelectric layer and a second conductive layer is then formed on top of the ferroelectric layer.

Desu, et al, U.S. Pat. No. 5,431,958 describes a method of forming a ferroelectric lead zirconate titanate film by metal organic CVD. The method teaches the introduction of separate lead, zirconium and titanium precursor compounds and an oxidizing agent into a CVD reactor under specified conditions.

In all of the conventional processes that use the perovskite material as a ferroelectric, the top and bottom plate of the capacitor and the insulating middle layer are fabricated separately and sequentially. The top and bottom plates are made out of conductive material, to function as electrodes; with the insulator or dielectric disposed between the two electrodes. That is to say that a first electrode or bottom plate is fabricated, most commonly by CVD or plasma-assisted deposition, followed by the deposition of the ferroelectric material onto the bottom plate and then the top plate is fabricated on top of the ferroelectric or perovskite dielectric layer.

In addition to the fact that all of the conventional processes for fabricating a ferroelectric capacitor construct each layer separately, the most commonly used processes for making a ferroelectric film are often cumbersome and difficult to integrate with other common fabrication steps used in semiconductor device manufacture. What is still needed is a method to fabricate metal oxide and ferroelectric films and devices that is more efficient and compatible with the overall process of semiconductor fabrication.

SUMMARY OF THE INVENTION

The present invention is a method of in-situ formation of metal oxide films and more particularly ferroelectric films. In the case of ferroelectric films the method comprises the steps of: forming a starting layer of metal on top of an oxide layer, wherein the metal for the starting layer is capable of forming a ferroelectric material by reducing the underlying oxide layer. Incorporating into the starting layer at least a second metal capable of being oxidized by the products of the reduction of the oxide layer by the first metal, forming a layer containing a plurality of metals, and heating the plurality of metals layer in the presence of nitrogen.

Additional advantages and novel features of the invention will be set forth in part in the description that follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF THE INVENTION

The present invention, broadly stated, is directed to a method of in-situ formation of a metal oxide film with specific desired properties. The process of the invention generally stated, includes the steps of: forming a starting layer of metal on top of an oxide layer, wherein the metal is selected such that it is capable of reducing the oxide layer. Further incorporating into the starting layer at least a second metal capable of being oxidized by the products of the reduction of the oxide layer by the first metal, and annealing the structure formed in the foregoing steps in an atmosphere that facilitates the oxidation and reduction reactions.

The present described embodiment is intended to be a non-limiting example and serve to better illustrate the utility of the invention. FIG. 1 shows an overview of the steps in an exemplary embodiment of this invention. The basic concept of each step in the exemplary embodiment will be described first and then the details of the process or processes used to accomplish each step will be described in further detail, as appropriate. In the present example titanium is used as the metal formed in the starting layer produced in accordance with the method of this invention. Lead (Pb), zirconium (Zr) and titanium (Ti) are used as the metals to form the perovskite ferroelectric of lead zirconate titanate, having the formula $Pb_x(Zr_yTi_{1-y})O_3$, and referred to as PZT.

Figure 1A:
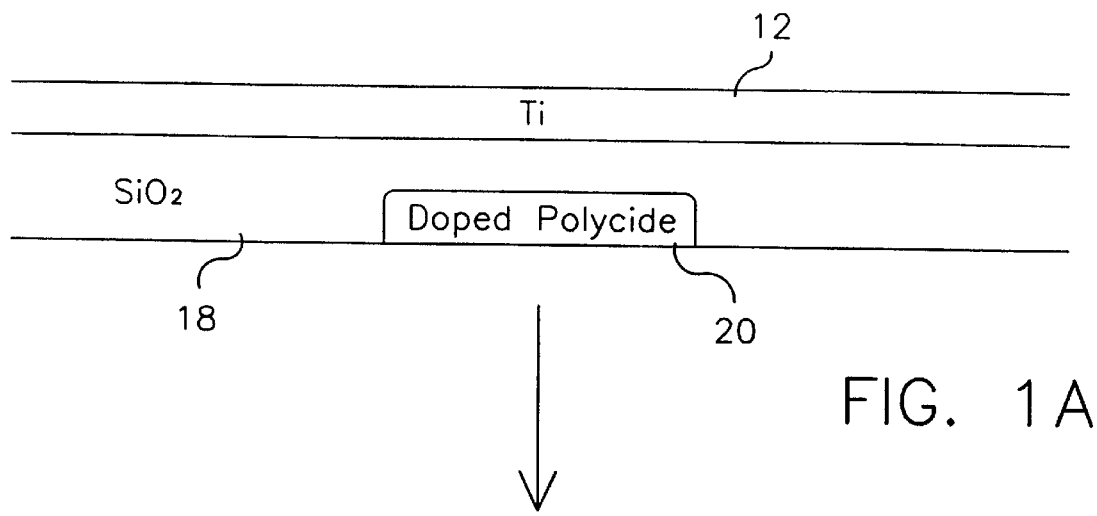
FIGS. 1A through 1C are schematics showing the general steps for the described embodiment of this invention.
Figure 1B:
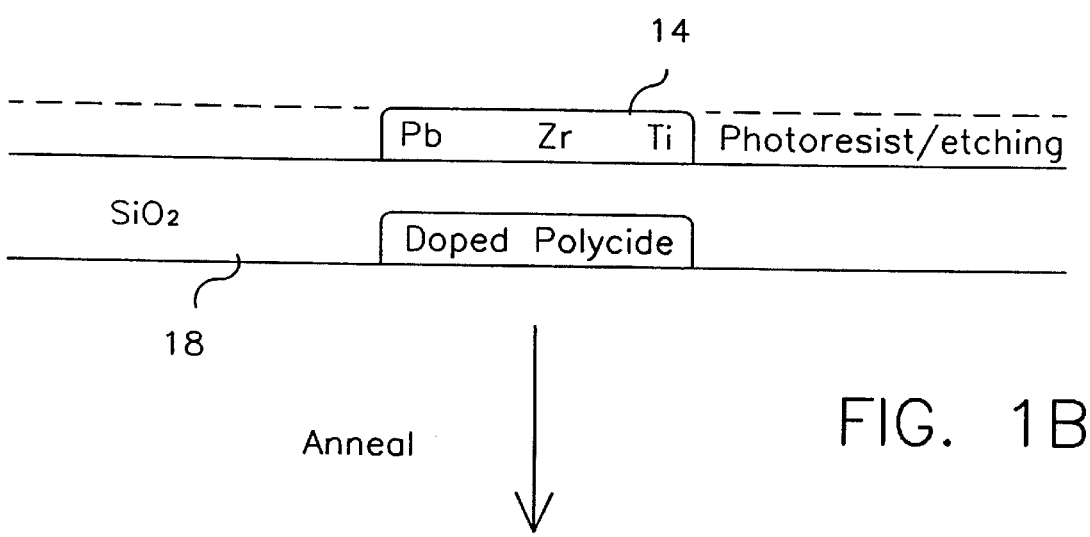
Figure 1C:
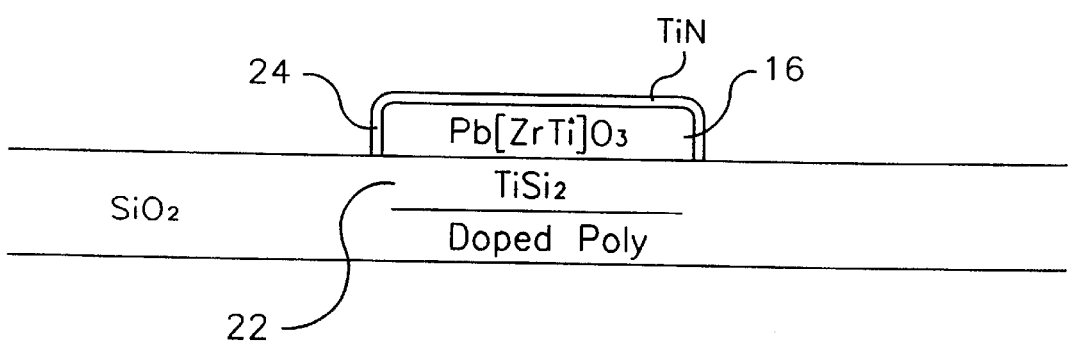

A starting layer 12 of titanium is formed on top of a layer containing an oxide layer on a substrate. In this example the oxide layer is $SiO_2$ and the substrate is a semiconductor wafer, as seen in FIG. 1A. Lead and zirconium are incorporated into titanium starting layer 12, as seen in FIG. 1B. If it is desirable for a particular application to pattern the layer containing the Pb, Zr and Ti, it is preferable to do so at this point, as the Pb—Zr—Ti metal compound is easier to process for removal, for example by etching, at this stage as opposed to after it has been oxidized to become lead zirconate titanate (PZT), later in the process. The Ti layer, with the incorporated Pb and Zr is then annealed in a nitrogen ambient environment. After the annealing step, Pb—Zr—Ti layer 14 becomes $PbZrTiO_3$ (PZT) layer 16. A layer 22 of titanium silicide ($TiSi_2$) is formed below PCT layer 16 and a layer 24 of titanium nitride (TiN) is formed above and in contact with PZT layer 16, as can been seen in FIG. 1C. The Ti reduces the $SiO_2$ to $TiSi_2$ and releases $O_2$. This diffuses into the unreacted metal layer and oxidizes it to form the ferroelectric material.

Referring to FIGS. 1–4, a preferred, exemplary method for in-situ formation of a ferroelectric capacitor is described below in more detail.

As shown in FIG. 1, a starting layer 12 of metal is formed on top of oxide layer 18, in this example $SiO_2$. Optionally, as shown in FIG. 1, layer 18 can include other desired materials, here a patterned section 20 of doped polycide. In the present example starting metal layer 12 is titanium, but other metals that are capable of forming a ferroelectric and are suitable to serve as an electrode in a capacitor on an integrated circuit can also be used; provided the selected metals are capable of reducing $SiO_2$ or the desired underlying oxide layer. Other suitable metals that are capable for forming a ferroelectric and meet the other requirements described above include, by way of non-limiting example, tantalum (Ta), tungsten (W) and hafnium (Hf).

Layer 12 of titanium can be formed by any suitable means. In this example it is preferably formed by plasma enhanced (PE) chemical vapor deposition (CVD). Other suitable means of forming starting layer 12 include CVD, sputtering methods of deposition and electroplating.

Turning now to the reactant gas sources for the metal deposition step to form starting layer 12, in the exemplary embodiment of the inventive process, the gases can be provided in any form that produces the desirable reactive species relative to the metal or conductive material that needs to be deposited. The deposition source gases can be provided in either a gas phase or as a liquid source converted to the gas phase through a bubbler system, as described below.

In the deposition of the titanium starting layer 12, using this invention, a desirable precursor deposition gas can be formed from titanium tetrachloride ($TiCl_4$). Argon can optionally be used as a non-deposition gas and bubbled through the $TiCl_4$ to form the reactant gas species. Alternatively, a precursor deposition gas for titanium may be selected from any suitable titanium source, including for example, titanium tetrabromide, titanium tetraiodide, tetrakis (diethylamino) titanium and tertakis (diethylamino) titanium.

The deposition rate of the CVD film is directly related to the reaction rate within the CVD chamber and depends on several parameters, including chemical source; flow rate, deposition temperature and pressure; and the percentage or relative fraction of reactant species available. The parameters can all be varied and controlled to achieve the desired reaction and film quality.

For plasma enhanced chemical vapor deposition (PECVD) titanium film deposition for starting layer 12 in an inductively coupled (IC) chemical vapor deposition (CVD) reactor, the process of the invention, generally stated, includes the steps of: placing the substrate in an IC CVD reaction chamber under a preselected vacuum pressure; introducing a preselected composition of processing gas into the reaction chamber for metal deposition on substrate 40; and generating a plasma from the gas within the reaction chamber using a power source inductively coupled to the reaction chamber.

Figure 2:
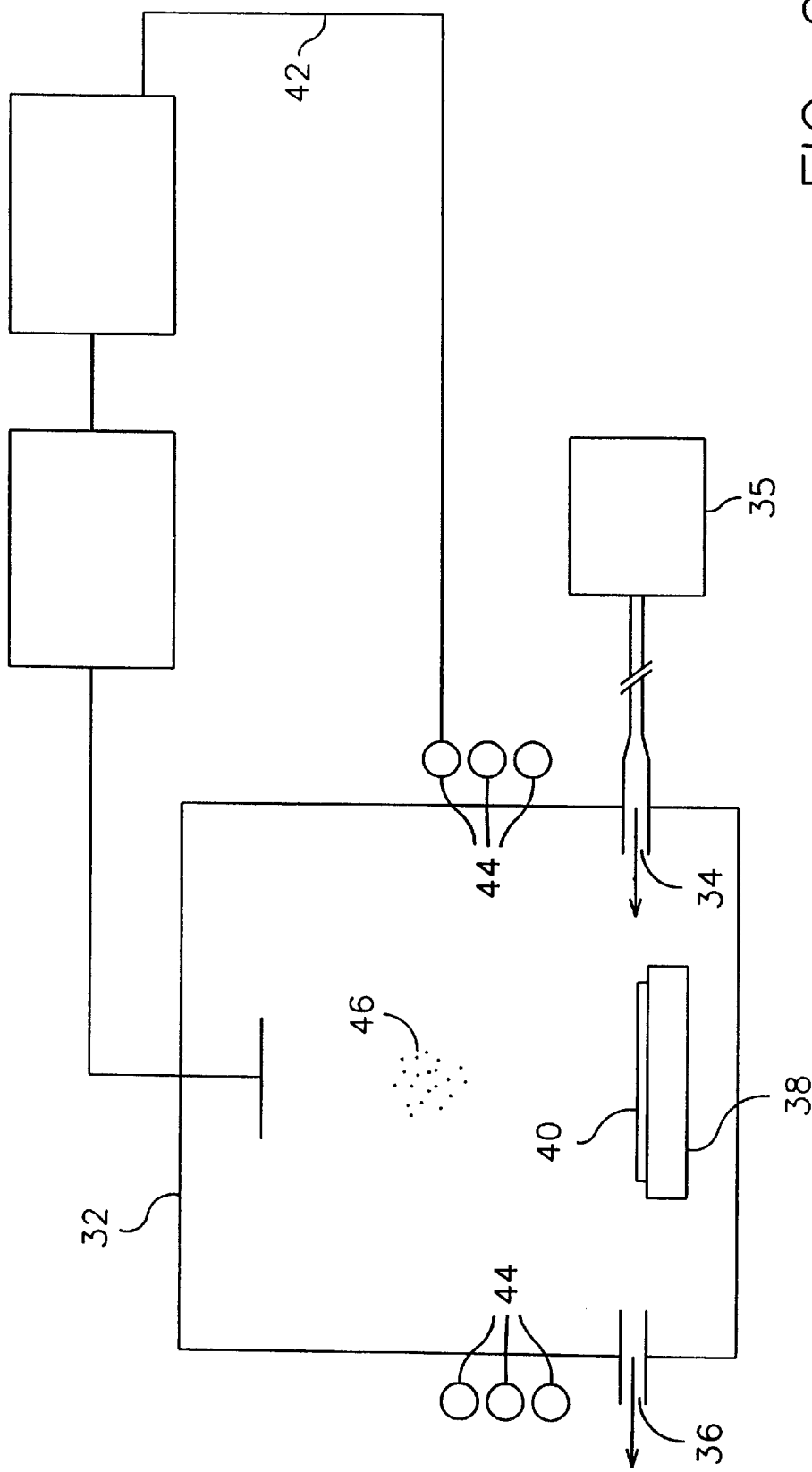
FIG. 2 is a schematic drawing of an exemplary plasma etch apparatus suitable for use with the process of this invention.

Referring to FIG. 2, the titanium film deposition for starting layer 12 may be accomplished by the following procedures. A radio-frequency inductively coupled (IC) type of PECVD apparatus is provided with a reaction chamber 32 that has a gas inlet port 34 in flow communication with a source 35 for supplying titanium metal precursor deposition gas 46 and a gas exhaust port 36 in flow communication with a source of vacuum for exhausting gas from chamber 32 and for maintaining a predetermined degree of vacuum therein. The CVD system further includes a plasma generation means 42 arranged on an upper surface of reaction chamber 32; and a holder device 38 that holds a substrate 40, typically a semiconductor wafer, on which the metal deposition process step is performed in the plasma produced by the plasma generation means 42.

Plasma generation means 42 in this example includes a radio-frequency power source to antenna 44. Radio-frequency waves are generated inside reaction chamber 32 from antenna 44, and titanium metal precursor deposition gas 46 is activated by this electromagnetic energy to cause the generation of a plasma. Other means for generating a plasma are suitable and well known in the art and include, for example, a pair of oppositely placed electrodes, microwave sources, and other conductive and inductive power sources.

For an IC PECVD reactor, as described above, process temperatures in the range of 200° C. to 800° C. can be utilized. Process pressures for such an IC PECVD reactor 10 may be in the range of 1 mTorr to 10 mTorr and with gas flow rates in the range of 100 to 800 sccm's (standard cubic centimeters per minute).

Power from the radio-frequency power source typically is in the range of 50 to 150 watts with a frequency of the order of 13.56 MHz. Both the power and frequency can be varied over broad ranges, as is well known to those skilled in the art.

After a plasma is generated as described above, the titanium metal film for starting layer 12 is formed on the surface of oxide layer 18.

Elements necessary to form the final desired ferroelectric material are then incorporated into titanium layer 12, preferably using a high current implanter. Additional metals can also be applied on top and in contact with starting layer 12 by other suitable means, for example, electroplating but this is less desirable and less efficient for most types of integrated circuit fabrication. In this example the implanted compounds are lead and zirconium. After implantation, former starting layer 12 now contains lead, zirconium and titanium and is now implanted layer 14. Other suitable compounds, by way of non-limiting example, include strontium, barium, antimony, lanthanum lithium, niobate and yttrium. The relative proportions of metals that should be incorporated into starting layer 12 depend on the specific elements used.

Figure 3:
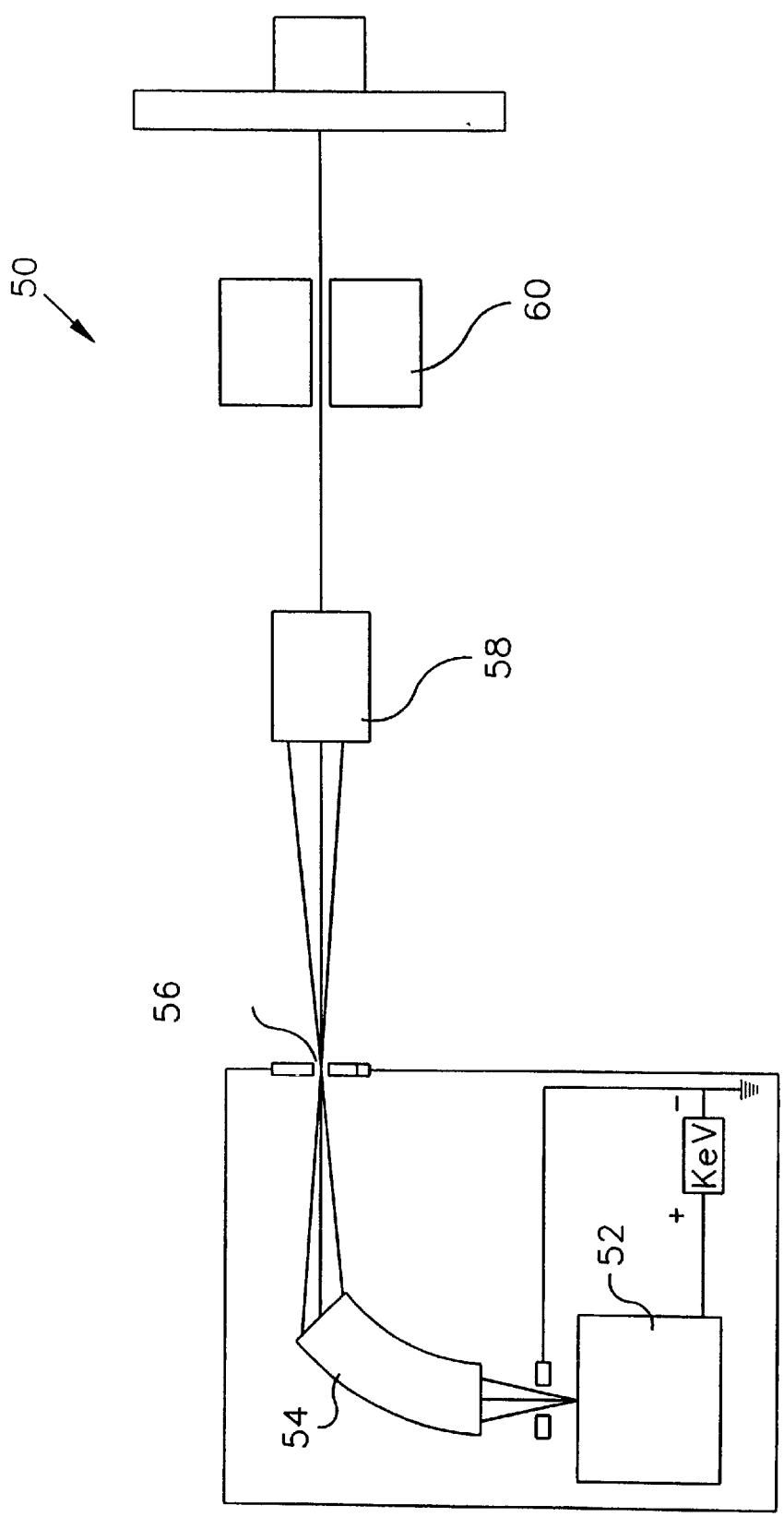
FIG. 3 is a schematic drawing of an implanter suitable for use with the described embodiment of this invention.

Briefly, a high current implant system 50 suitable for this step is described below, in reference to FIG. 3. Such a system includes an ion source assembly 52, an analyzing magnet assembly 54, a resolving aperture assembly 56, a post-acceleration component 58 and a wafer processing element 60. Ions which are generated in the ion source are extracted with voltages of 10 to 200 keV, preferable around 100 keV and a current of up to 30 mA, producing a ribbon beam directed toward analyzing magnet 54. Ions having the selected charge-to-mass ratio are focused by the analyzing magnet through the resolving aperture 56, to enter into post-acceleration component 58 where they are accelerated to a preselected energy before striking wafer processing element 60. Ions that are not of the defined mass and charge state will pass through accelerating magnet and be spatially separated according to their ionic mass and diverted away from resolving aperture 56 and thus are routed out of the final ion beam striking the target.

Optionally, after implantation, portions of layer 14 can be selectively removed at this time, if desired. Removal of any portion of layer 14 is preferably by etching, but other suitable means may also be used, for example laser ablation or chemical mechanical polishing.

Conditions and procedures for etching a metal surface in integrated circuit manufacture are well known and well described in existing literature and will only be described briefly here. Although etching or removal of portions of layer 14 can be accomplished later in the fabrication process, removal at this step is preferable over later in the process because the Pb—Zr—Ti containing layer 14 is more easily etched than the yet to be formed $PbZrTiO_3$ (PZT) layer 16.

Briefly, photoresist is applied as a thin film to the substrate (e.g. $SiO_2$ on Si), and subsequently exposed through a mask. The mask contains clear and opaque features that define the pattern to be created in the photoresist layer. The resist is then treated with a developer. Following development, the regions no longer covered by resist are then etched as desired.

After removal of any portions of Pb—Zr—Ti metal layer 14, it is annealed by any suitable means, preferably under rapid thermal processing (RTP) conditions.

Conditions and procedures for annealing processes in integrated circuit manufacture are well known and well described in existing literature and will only be described briefly here. A heating chamber coupled to a radian energy source is used; various heat sources are utilized, including arc lamps, tungsten-halogen lamps, and resistively-heated slotted graphite sheets. Process temperatures for RTP range between 400° C. to 650° C., preferably about 500° C. Process times for this step range between 5 seconds to 5 minutes, preferably about 10 seconds.

The anneal causes the formation of a metal silicide layer; with the general formula of $MSi_x$, in this example it is layer 22, a titanium silicide with the formula $TiSi_2$. Layer 22 forms below what was metal (Pb—Zr—Ti) layer 14. The lead-zirconium-titanium metal layer 14 becomes the ferroelectric $PbZrTiO_3$, in what is now layer 16, in FIG. 1C.

In another embodiment a metal oxide can be formed that has a set of selected characteristics. For example, an oxide containing baselayer would be provided and a metal overlayer would be formed on top of and in contact with the baselayer. The metal overlayer must be capable of reducing the baselayer. Additional desirable metals may be added to the overlayer. The additional metals can be selected to provide desired characteristics for the metal oxide formed as the product; as can be seen in the ferroelectric oxide example above. The layers are then heated in a manner, such as annealing, to form the desired metal oxide. The oxygen source for the metal oxide formation can come from either the reduction reaction products of the baselayer and overlayer or oxygen in the heating/annealing environment.

With the method of this invention a ferroelectric film can be formed in-situ, on an electronic or semiconductor device, using fewer steps and a more efficient and easier process than current methods for forming dielectrics. It is an additional advantage that layer 14 can be shaped, such as by etching, while it has a composition that is more amenable to such procedures, rather than later in the fabrication process, after it has become ferroelectric layer 16.

Some metal oxide materials that can be made using this invention are also known to exhibit superconducting properties. The method of forming the ferroelectric layers described above are meant to be exemplary of the utility of this invention and not limiting, this method could easily be used for the formation of such layers to be used in superconductor applications, electro-optic applications and other applications While there is shown and described the preferred embodiment of the invention, it is to be distinctly understood that this invention is not limited thereto but may be variously embodied to practice within the scope of the following claims.

I claim:

1. A method of making a semiconductor device, comprising:

providing an oxide containing substrate having a layer formed thereon comprised of a plurality of metals capable of forming a ferroelectric oxide; and heating the layer such that one of the plurality of metals reacts with the oxide containing substrate to reduce the oxide containing substrate and to form a metal containing layer including a metal silicide.

2. The method of claim 1 wherein the layer is a metal oxide.

3. The method of claim 1 wherein the heating is in an inert gas ambient environment.

4. The method of claim 1 wherein the heating is in a nitrogen ambient environment and the oxide in the oxide containing substrate is silicon dioxide.

5. A method of making a semiconductor device, comprising:

providing an oxide containing substrate having a titanium layer formed thereon;

exposing at least a portion of said titanium layer to perovskite-type metals in a manner that cause the perovskite-type metals to become incorporated into the titanium layer; and heating the oxide containing substrate and titanium layer incorporated with the perovskite-type metals such that titanium in the titanium layer reacts with the oxide containing substrate to reduce the oxide containing substrate and to form a metal containing layer.

6. The method of claim 5 wherein an oxide in the oxide containing substrate is a metal oxide.

7. The method of claim 5 wherein the heating is in an inert gas ambient environment.

8. The method of claim 5 wherein the heating is in a nitrogen ambient environment and an oxide in the oxide containing substrate is silicon dioxide.

9. A method of making a semiconductor device, comprising:

providing a silicon dioxide containing substrate having a layer formed thereon, said formed layer comprised of a plurality of metals capable of forming a ferroelectric oxide, wherein at least one of the metals forms a metal silicide in a thermal reaction with silicon dioxide; and heating the layer and the silicon dioxide containing substrate.

10. A method of making a semiconductor device, comprising:

annealing a base layer having an oxide and an over layer, the over layer having a plurality of metals wherein at least one of the metals reacts with the oxide in the oxide containing base layer to reduce the oxide containing base layer and to form a metal containing layer, wherein the metal containing layer includes a metal silicide, and wherein the annealing is in an ambient environment containing sufficient oxygen to allow an in-situ formation of a metal oxide layer.

11. A method of making a semiconductor device, comprising:

annealing a base layer having an oxide and an over layer, the base layer including a silicon dioxide and the over layer having a plurality of metals, wherein at least one of the metals reacts with the oxide in the oxide containing base layer to reduce the oxide containing base layer and to form a metal containing layer, and wherein the annealing is in an ambient environment containing sufficient oxygen to allow an in-situ formation of a metal oxide layer.

12. A method of making a semiconductor device, comprising:

annealing an oxide base layer and a metal over layer, the metal over layer having a plurality of metals wherein at least one of the metals reacts with the oxide base layer to reduce the oxide base layer and to form a metal containing layer including a metal silicide and wherein the oxide base layer provides a sufficient oxygen source for a in-situ formation of a selected metal oxide layer.

13. A method of making a semiconductor device, comprising:

annealing an oxide base layer and a metal over layer, the oxide base layer including a silicon dioxide and the metal over layer having a plurality of metals wherein at least one of the metals reacts with the oxide base layer to reduce the oxide base layer and to form a metal containing layer and wherein the oxide base layer provides a sufficient oxygen source for a in-situ formation of a selected metal oxide layer.

14. A method of making an electronic device, comprising:

providing an oxide base layer having a sufficient source of oxygen for an in-situ formation of a metal oxide layer;

providing a metal over layer that is capable of reducing the oxide base layer;

incorporating at least a second metal to the metal over layer; and annealing the oxide base layer and the metal over layer such that a metal in the metal over layer reacts with the oxide base layer to reduce with the oxide base layer and to form a metal containing layer including a metal silicide.

15. A method of making an electronic device, comprising:

providing an oxide base layer including silicon dioxide and having a sufficient source of oxygen for an in-situ formation of a metal oxide layer;

providing a metal over layer that is capable of reducing the oxide base layer;

incorporating at least a second metal to the metal over layer; and annealing the oxide base layer and the metal over layer such that a metal in the metal over layer reacts with the oxide base layer to reduce with the oxide base layer and to form a metal containing layer.

16. A method of making an electronic device, comprising:

annealing an over layer having titanium, lead and zirconium, wherein the over layer is in contact with at least an oxide containing layer on a substrate such that the titanium in the over layer reacts with the oxide containing layer to reduce the oxide containing layer and to form a metal base layer.

17. The method of claim 16, wherein the metal base layer includes a metal silicide.

18. The method of claim 16, wherein the oxide containing layer includes a silicon dioxide.

19. A method of making a semiconductor device, comprising:
annealing a layer containing a plurality of metals that are capable of forming a ferroelectric oxide, wherein said layer is in contact with at least an oxide containing layer on a substrate, wherein one of the plurality of metals reacts with the oxide containing layer to reduce the oxide containing layer and to form a metal base layer.

20. The method of claim 19, wherein the metal base layer includes a metal silicide.

21. The method of claim 19, wherein the oxide containing layer includes a silicon dioxide.

22. A method of making a semiconductor device, comprising:
forming an over layer with a plurality of metals that react to form a ferroelectric oxide, wherein said over layer is in contact with an oxide containing base layer; and
heating the oxide containing base layer and the over layer, such that a metal of the plurality of metals reacts with the oxide containing layer to form a metal base layer.

23. The method of claim 22 wherein the oxide containing baselayer is a metal oxide.

24. The method of claim 22 wherein the heating is in an inert gas ambient environment.

25. The method of claim 22 wherein the heating is in a nitrogen ambient environment and the oxide containing baselayer is silicon dioxide.

26. The method of claim 22 further comprising removing preselected portions of the over layer before heating the oxide containing base layer and the over layer.

27. The method of claim 26 wherein the oxide containing baselayer is a metal oxide.

28. The method of claim 26 wherein the heating is in an inert gas ambient environment.

29. The method of claim 26 wherein the heating is in a nitrogen ambient environment and the oxide containing baselayer is silicon dioxide.

30. A method of making an electronic device, comprising:
forming a starting layer of metal on top of and in contact with an oxide containing base layer, wherein the metal for the starting layer is capable of forming a ferroelectric oxide;
incorporating at least a second metal capable of forming a ferroelectric oxide into the starting layer, to form an over layer containing a plurality of metals; and
heating the oxide containing base layer and over layer, such that one of the plurality of metals reacts with the oxide containing base layer to form a metal base layer.

31. The method of claim 30 wherein the oxide containing baselayer is a metal oxide.

32. The method of claim 30 wherein the heating is in an inert gas ambient environment.

33. The method of claim 30 wherein the heating is in a nitrogen ambient environment and the oxide containing baselayer is silicon dioxide.

34. The method of claim 30 further comprising removing preselected portions of the over layer incorporating at least a second metal, before heating the oxide containing base layer and the over layer.

35. The method of claim 34 wherein the oxide containing baselayer is a metal oxide.

36. The method of claim 34 wherein the heating is in an inert gas ambient environment.

37. The method of claim 34 wherein the heating is in a nitrogen ambient environment and the oxide containing baselayer is silicon dioxide.

38. A method of making a semiconductor device, comprising:
forming a layer of titanium on top of an oxide containing layer;
incorporating at least one perovskite metal into said layer of titanium; and
heating the oxide containing layer and the layer of titanium such that the titanium reacts with the oxide containing baselayer to form a metal base layer.

39. The method of claim 38 wherein the oxide containing layer is a metal oxide.

40. The method of claim 38 wherein the heating is in an inert gas ambient environment.

41. The method of claim 38 wherein the heating is in a nitrogen ambient environment and the oxide containing layer is silicon dioxide.

42. A method of making a semiconductor device, comprising:
forming a layer of titanium in contact with a layer of metal that reacts to form a ferroelectric oxide wherein the layer of titanium and the layer of metal are on and in contact with at least a portion of an oxide containing assembly on a substrate; and
heating the oxide containing assembly, such that the titanium reacts with the oxide containing assembly to form a base layer having titanium.

43. The method of claim 42 wherein an oxide in the oxide containing assembly is a metal oxide.

44. The method of claim 42 wherein an oxide in the oxide containing assembly is a metal oxide.

45. The method of claim 42 wherein the heating is in a nitrogen ambient environment and an oxide in the oxide containing assembly is silicon dioxide.

46. A method of making a semiconductor device, comprising:
forming a layer of titanium on top of and in contact with an oxide containing layer;
incorporating at least one metal into the layer of titanium, wherein the incorporated metal is capable of forming a ferroelectric oxide, to form an over layer containing a plurality of metals;
removing unwanted portions of the over layer; and
annealing the oxide containing layer and the over layer, such that the titanium in the layer of titanium reacts with the oxide containing layer to form a base layer having titanium.

47. The method of claim 46 wherein the oxide containing layer is a metal oxide.

48. The method of claim 46 wherein the annealing is in an inert gas ambient environment.

49. The method of claim 46 wherein the annealing is in a nitrogen ambient environment and the oxide containing layer is silicon dioxide.

50. A method of making a semiconductor device, comprising:
forming a top layer containing at least titanium, lead, and zirconium on top of and in contact with at least a portion of an oxide containing layer on a semiconductor substrate; and
annealing the top layer and the oxide containing layer, such that the titanium in the top layer reacts with the oxide containing layer to form a base layer having titanium.

51. The method of claim 50 wherein the oxide containing layer is a metal oxide.

52. The method of claim 50 wherein the annealing is in an inert gas ambient environment.

53. The method of claim 50 wherein the annealing is in a nitrogen ambient environment and the oxide containing layer is silicon dioxide.

54. The method of claim 50 further comprising removing unwanted portions of the top layer containing at least titanium, lead, and zirconium, before annealing the top layer and the oxide containing layer.

55. The method of claim 54 wherein the oxide containing layer is a metal oxide.

56. The method of claim 54 wherein the annealing is in an inert gas ambient environment.

57. The method of claim 54 wherein the annealing is in a nitrogen ambient environment and the oxide containing layer is silicon dioxide.

58. A method of making a semiconductor device, comprising:
forming an overlayer with a plurality of metals that react to form perovskite-like structures and at least one of the metals forms a metal silicide in a thermal reaction with silicon dioxide, wherein the overlayer is on and in contact with a silicon dioxide containing assembly on a substrate;
removing preselected portions of the overlayer; and
heating the overlayer.

59. The method of claim 58 wherein the heating is in an inert gas ambient environment.

60. The method of claim 58 wherein the heating is in a nitrogen ambient environment.

61. A method of making a ferroelectric capacitor, comprising:
forming a starting layer on a top of an oxide layer, the starting layer having a plurality of metals;
annealing the starting layer and the oxide layer, such that one of the plurality of metals reacts with the oxide layer to reduce the oxide layer and to form a base electrode layer and such that the oxide layer provides a sufficient oxygen source for an in-situ formation of a ferroelectric-based dielectric material on top the base electrode layer and such that a top electrode layer is formed on top of the ferroelectric-based dielectric material.

62. The method of claim 61, wherein one of the plurality of metals includes a metal selected from the group consisting of titanium, tantalum, tungsten and hafnium.

63. The method of claim 61, wherein the oxide layer include silicon dioxide.

64. The method of claim 61, wherein the base electrode layer includes a metal silicide.

65. A method of making a ferroelectric capacitor, comprising:
forming a starting layer on a top of an oxide layer, the starting layer having a plurality of metals;
annealing the starting layer and the oxide layer, such that one of the plurality of metals reacts with the oxide layer to reduce the oxide layer and to form a base electrode layer, such that the annealing is in an ambient environment containing sufficient oxygen to allow an in-situ formation of a ferroelectric-based dielectric material on top the base electrode layer, and such that a top electrode layer is formed on top of the ferroelectric-based dielectric material.

66. The method of claim 65, wherein one of the plurality of metals includes a metal selected from the group consisting of titanium, tantalum, tungsten and hafnium.

67. The method of claim 65, wherein the oxide layer include silicon dioxide.

68. The method of claim 65, wherein the base electrode layer includes a metal silicide.

* * * * *

UNITED STATES PATENT AND TRADEMARK OFFICE
CERTIFICATE OF CORRECTION

PATENT NO. : 6,372,519 B1
DATED : April 16, 2002
INVENTOR(S) : Terry L. Gilton

It is certified that error appears in the above-identified patent and that said Letters Patent is hereby corrected as shown below:

Title page,
Item [54], Title, delete "FERROELECTIC" and insert -- FERROELECTRIC --, therefor.
Item [56], References Cited, OTHER PUBLICATIONS, delete "BaTio3" and insert -- BaTiO$_3$ --, therefor.
Delete "vol." and insert -- Vol. --, therefor.

Column 4,
Line 4, delete "been" and insert -- be --, therefor.

Column 12,
Line 6, insert -- of -- after "top".

Signed and Sealed this

Twenty-second Day of October, 2002

Attest:

Attesting Officer

JAMES E. ROGAN
Director of the United States Patent and Trademark Office